United States Patent [19]

Sawada et al.

[11] 4,204,156
[45] May 20, 1980

[54] APPARATUS FOR ALIGNING BRUSHES OF A DYNAMOELECTRIC MACHINE

[75] Inventors: Fred H. Sawada, Scotia; Melvin Howenstein, Schenectady, both of N.Y.

[73] Assignee: General Electric Company, Schenectady, N.Y.

[21] Appl. No.: 921,214

[22] Filed: Jul. 3, 1978

[51] Int. Cl.² .................. G01R 31/02; G08B 21/00
[52] U.S. Cl. ........................ 324/158 MG; 340/635
[58] Field of Search .............. 324/158 MG; 322/99; 318/490; 361/20, 23, 30, 31, 33; 340/635, 679, 659, 662

[56] References Cited

U.S. PATENT DOCUMENTS

| | | | |
|---|---|---|---|
| 3,653,019 | 3/1972 | Barton et al. | 340/635 |
| 3,864,803 | 2/1975 | Ohmstedt et al. | 29/205 R |
| 4,058,804 | 11/1977 | Sawada et al. | 340/635 |

Primary Examiner—Rudolph V. Rolinec
Assistant Examiner—Ernest F. Karlsen
Attorney, Agent, or Firm—John F. Ahern; James W. Mitchell; Ormand R. Austin

[57] ABSTRACT

Apparatus is disclosed for aligning brushes of a dynamoelectric machine such as a DC generator or motor to minimize arcing of the brushes. The alignment monitor processes electrical signals from brushes of a dynamoelectric machine during tests in which various levels of buck or boost current are superimposed on a preselected level of excitation current applied to the machine, and the monitor produces output signals which, together with the levels of applied buck or boost currents, are indicative of the brushholder rigging adjustment which is required to achieve the optimum rigging position for a wide range of arc-free machine operation. Included in the brush alignment monitor are filter networks for removing noise from composite signals input to the monitor, a rectifier for changing the sign of negative signal components, and networks which amplify and integrate selected high-frequency information signals to produce output signals. Also described is an alarm system which indicates the presence of brush arcing during alignment tests by comparing the output signals with a reference signal which is either preset from prior observations of brush arcing or is automatically adjustable for changes in buck and boost currents, the latter permitting the monitor to detect directly the onset of brush arcing and thus the range of arc-free operation of the machine.

8 Claims, 9 Drawing Figures

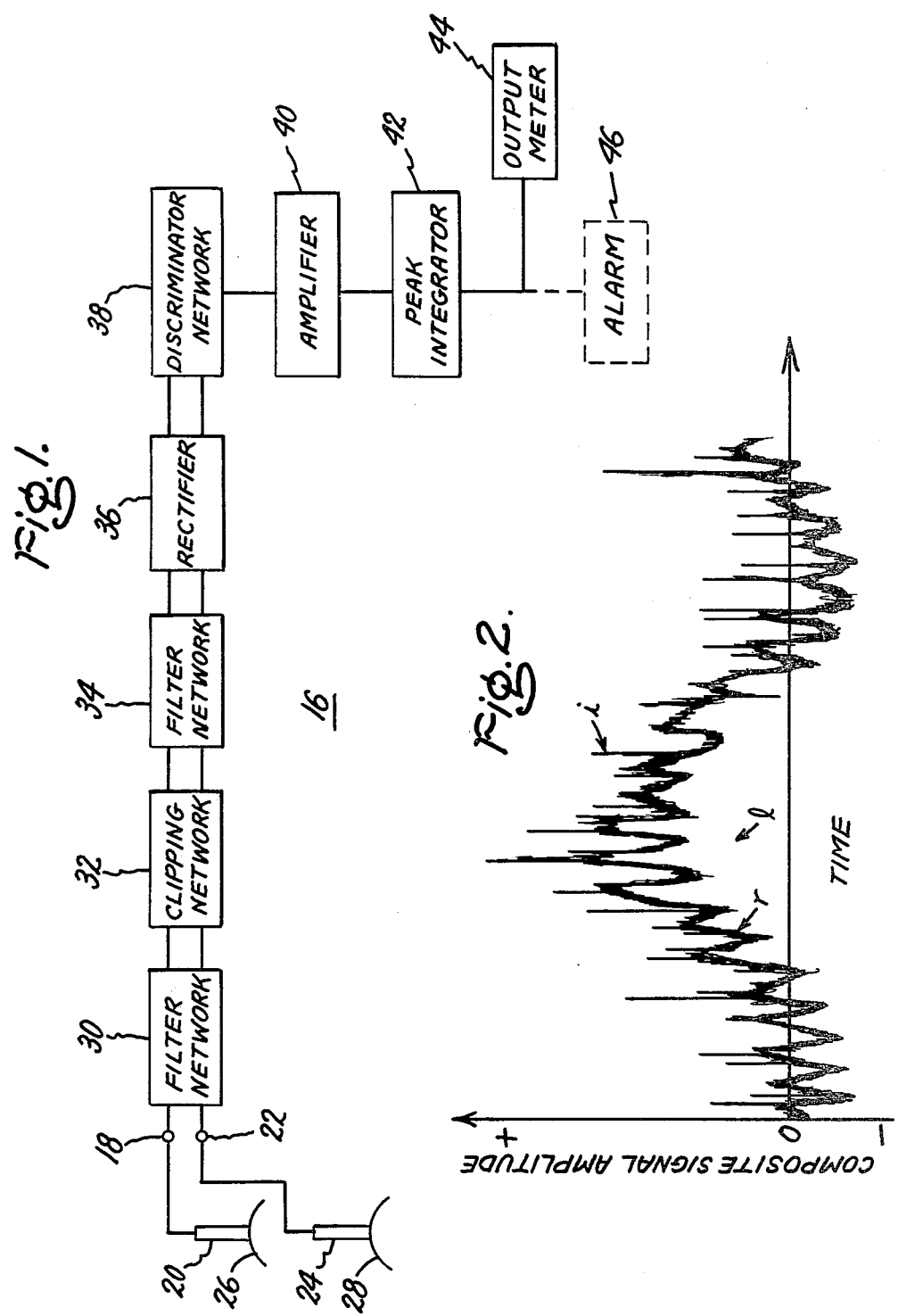

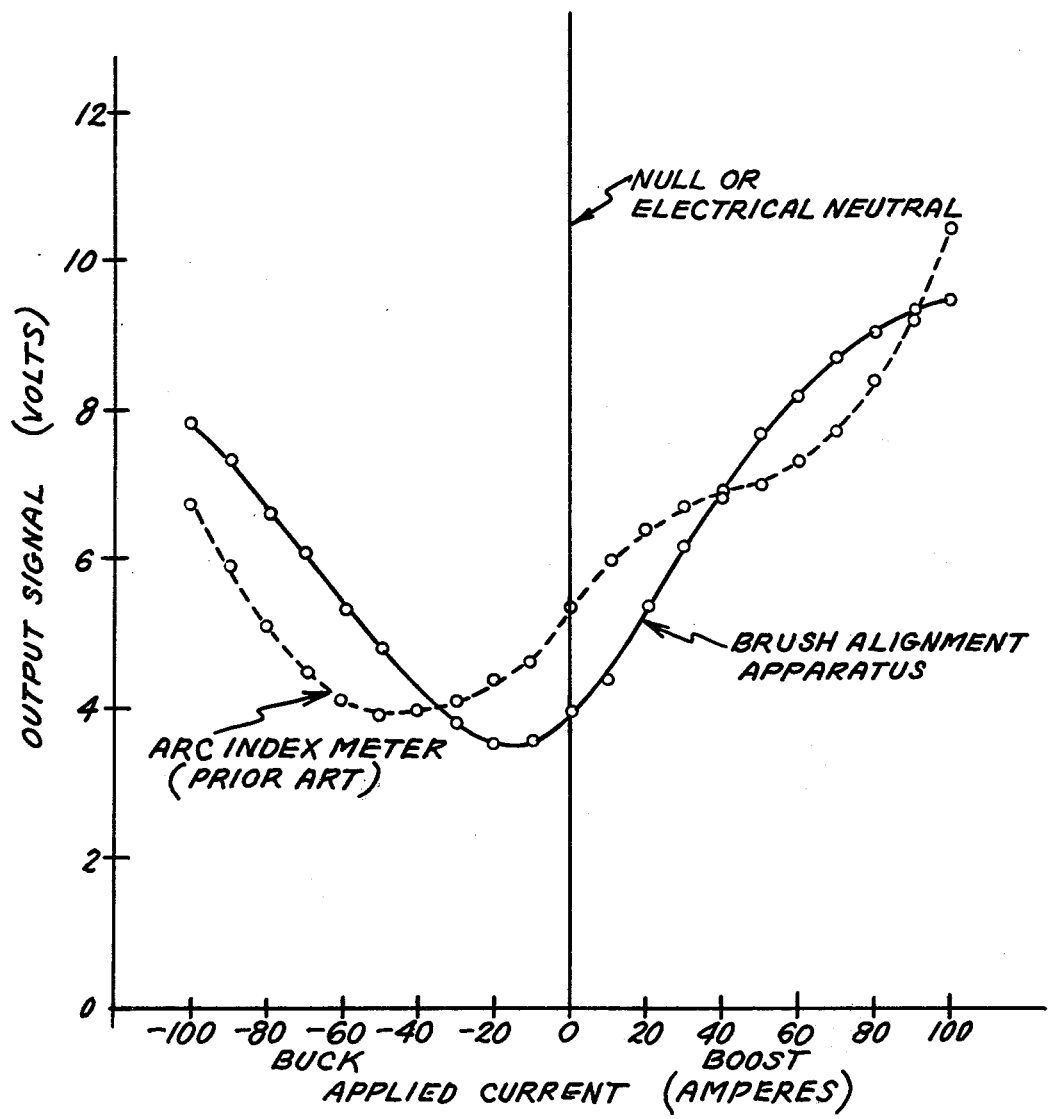

APPARATUS FOR ALIGNING BRUSHES OF A DYNAMOELECTRIC MACHINE

BACKGROUND OF THE INVENTION

This invention relates generally to a system for processing electrical signals and in particular to apparatus for aligning brushes of a dynamoelectric machine to minimize arcing of the brushes.

In dynamoelectric machines such as DC generators, brushes are used to conduct current to and from collector slip rings or commutators attached to a rotor. Typically the brushes are mounted in a stationary brushholder assembly or rigging such as is shown for a large generator in U.S. Pat. No. 3,864,803 to Ohmstedt et al of common assignee to the present invention. This assembly supports the brushes and allows them to ride stably on the slip ring surface of the rotor. Although the brushholder rigging is held in fixed position during operation of the dynamoelectric machine, a small amount of rotational adjustment is often provided to permit varying of the commutation angle of the brushes for optimum performance of the dynamoelectric machine. In particular, the rigging should be set at a position such that arcing of the brushes during operation of the machine is avoided since, as is well known, arcing between the brushes and rotor slip ring results in electrical losses and can lead to damage to rotor slip rings, brushes, and brushholder riggings, forcing outages and repairs.

For most machines the total art length through which the brushholder rigging may be rotated without resulting in brush arcing is quite small, e.g., less than an inch even for large generators of power ratings up to 3000 kilowatts. The optimum rigging position within this narrow arc-free region, which is known as the "black band" because of the absence of visible brush arcing when the machine is operated in this region, is normally determined for a generator prior to shipment by means of tests known as "buck" and "boost" tests. During these tests, which may be conducted at part generator load or at full load, current is applied to the generator field either in excess of that normally furnished by the excitation system ("boost" current) or less than that normally furnished ("buck" current), and output signals from the brushes are measured by a meter. In general the brush output signals rise with increasing magnitude of buck or boost current applied, defining, when output signal is plotted against applied current, a curve approximately parabolic in shape whose minimum value of output signal may occur at a valve of applied current on either side of the electrical neutral, the point at which only normal excitation current (no buck or boost current) is being applied to the generator field. The two end points of the parabolic-shaped curve are defined by levels of buck and boost current and output signal at which the brushes begin arcing as determined optically or by means of a brush arc monitor such as is described in U.S. application Ser. No. 901,579, filed May 1, 1978, now U.S. Pat. No. 4,163,227, by Sawada et al and of common assignee to the present invention. For each brushholder rigging setting a different parabolic-shaped curve may be generated, and the optimum rigging setting is determined as that for which the minimum output signal occurs at, or displaced a prescribed increment of current from, electrical neutral, and also as that which has substantially the maximum arc-free range of buck and boost currents. These criteria assure minimum brush arcing during normal operation of the dynamoelectric machine and thus long brush and slip ring lives.

Prior to the present invention, the above-described output signals obtained during brush alignment tests were fed to a current-measuring device known as an arc index meter, and arcing at the end points of the output curve was detected visually using mirrors placed near the brushes. Although used extensively in alignment of generator brushes, this arc index meter is deficient in certain respects. First, the onset of brush arcing, which must be determined to establish the arc-free range of operation, is not detectable using the arc index meter but must be located by other means. Also, during alignment of the brushes of certain generators, particularly those with high levels of inherent noise, the curves of brush output signal versus applied current resulting from use of the arc index meter include ill-defined regions and in particular lack the well-defined minimum value of output signal required for precise alignment of machine brushes. Further, the response time of this prior art device is long, making accurate readings difficult and time-consuming to obtain. Finally, this instrument lacks the range of sensitivity necessary to accurately align brushes for the wide variety of dynamoelectric machine sizes and power ratings currently being manufactured.

Accordingly, it is an object of the invention to provide improved apparatus for aligning brushes of a dynamoelectric machine for minimum arcing of the brushes.

It is another object of the invention to provide apparatus for quickly and accurately aligning brushes for dynamoelectric machines in a wide range of sizes and power ratings.

It is a further object of the invention to provide apparatus which, in addition to facilitating alignment of brushes of a dynamoelectric machine, also is operable to detect the onset of brush arcing.

SUMMARY OF THE INVENTION

Brush alignment apparatus is provided to permit rapid, accurate alignment of brushes of a dynamoelectric machine such as a generator to minimize arcing of the brushes. In a preferred embodiment the alignment monitor processes composite signals received from a generator to which various levels of buck or boost current have been applied and produces output signals which, together with the levels of buck and boost current, indicate the brush alignment adjustment required to minimize brush arcing. The monitor preferably includes two filter networks for removing from the composite signal received by the monitor substantially all noise components having frequencies less than a cutoff value determined from slot and bar geometry of the generator; a clipping network to protect system circuitry and prevent passage of high amplitude transients or noise spikes; a rectifier and a discriminator network to permit passage, at any given time, of the information signal of maximum amplitude; means for amplifying and integrating the information signal of maximum amplitude; and an alarm system for indicating the presence of brush arcing. In one embodiment of the alignment monitor, the alarm system is adapted to indicate the onset of brush arcing when the output signal attains a level at which initial arcing has been determined by prior observation; in certain other preferred embodiments the alarm system includes means for automatically detecting the onset of arcing and thus the arc-free operating range of the generator.

BRIEF DESCRIPTION OF THE DRAWINGS

While the specification concludes with claims particularly pointing out and distinctly claiming the subject matter of the invention, the invention will be better understood from the following description taken in connection with the accompanying drawings in which:

FIG. 1 is a block diagram of a preferred embodiment of the invention;

FIG. 2 is a sketch of a composite signal such as may be processed by the brush alignment apparatus;

FIG. 4 is a graph showing plots of values of brush output signal versus applied current as measured by a prior art device and by the brush alignment apparatus of the invention during brush alignment tests;

DETAILED DESCRIPTION OF THE INVENTION

Figure 3A:
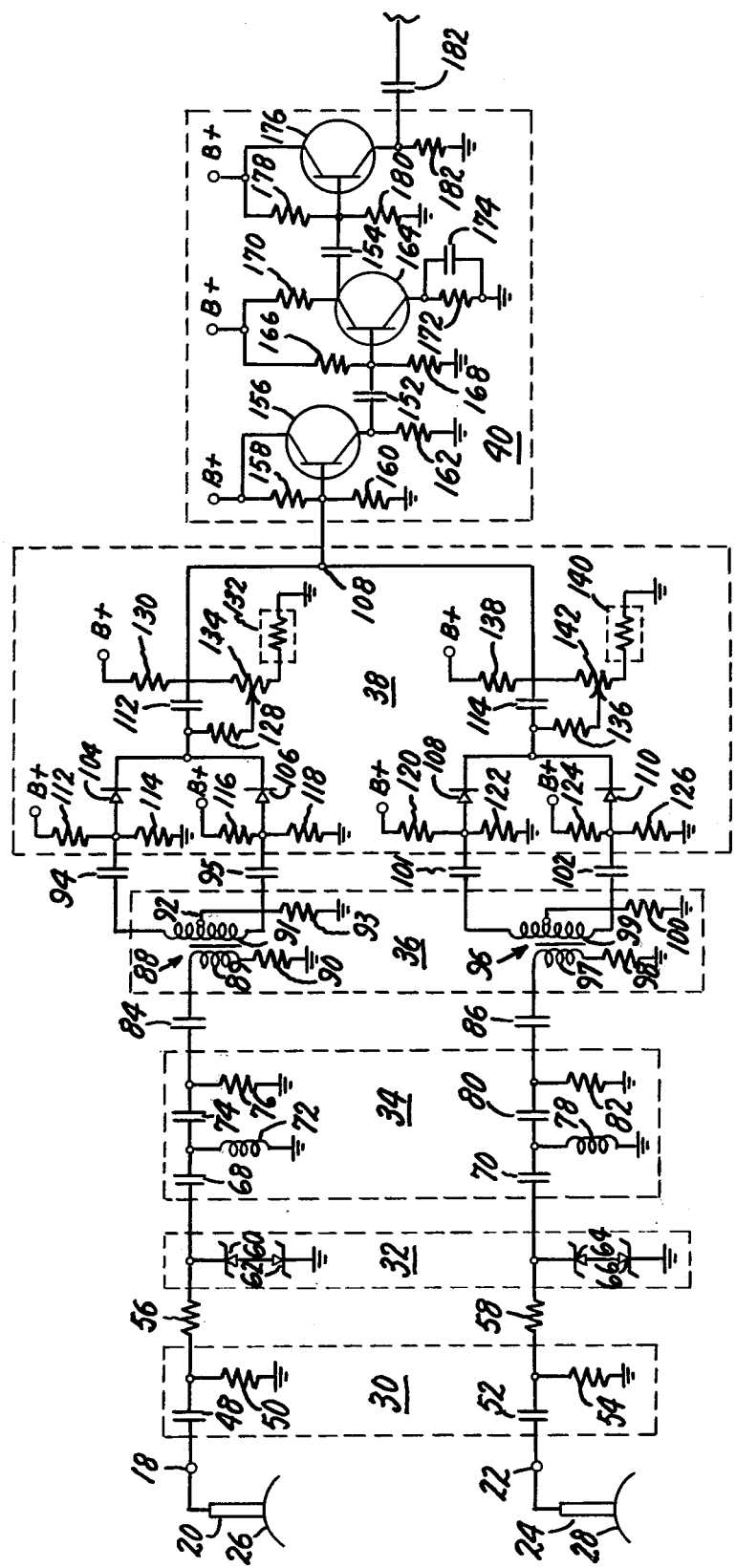
FIGS. 3a and 3b are a schematic of a preferred embodiment of the invention whose block diagram is given in FIG. 1.

Before the structure and operation of the brush alignment apparatus are set forth in detail, a review of the particular intended uses of the invention is appropriate. The brush alignment apparatus or monitor described herein is especially suited for aligning brushes of a dynamoelectric machine such as, but not limited to, a DC generator so that during normal operation arcing of the brushes is avoided or minimized. This device is connected to the generator brushes during buck and boost tests wherein, by means of an auxiliary power supply, current is added to (boost) or substracted from (buck) a selected level of current applied to the generator by its associated excitation system. At an initial brushholder rigging setting and preferably at a no-load or low-load generator operating point, several different values of buck and boost current are applied and for each value of applied current an output meter on the brush alignment apparatus records an output signal, which may be a voltage or current. The brush alignment apparatus may also determine the arc-free range of buck and boost currents by indicating the onset of brush arcing at the maximum buck and boost currents applied. The output signals from the brush alignment apparatus, when plotted against applied current, yield a curve approximately parabolic in shape as illustrated, for example, in FIG. 4 which shows curves for a prior art device and the improved alignment apparatus of the present invention. The location of the minimum output signal with respect to electrical neutral (no buck or boost current applied) in these curves is indicative of the direction and amount of brushholder rigging adjustment required to attain the optimum position for avoidance of brush arcing. The brushholder rigging is adjusted the indicated amount, a second buck and boost sequence is run and output signals plotted, and the process repeated until the minimum output signal is obtained at a desired value of applied current with respect to electrical neutral. This is typically near the electrical neutral point but may be offset a small amount on the boost side since as the generator load is increased the minimum output signal location tends to shift slightly towards the buck side of neutral. After further checks at increased levels of loading, and rigging position adjustments as necessary, alignment of the generator brushes for minimum arcing operation is complete.

FIG. 1 shows a block diagram of a preferred embodiment of the brush alignment monitor 16 of the invention which has an input terminal 18 for receiving signals from a positive brush 20 and an input terminal 22 for receiving signals from a negative brush 24. Brushes 20 and 24 each may comprise several brushes connected in parallel and held in a brushholder rigging (not shown) in a conventional manner to bear against rotatable collector slip rings 26 and 28 of a dynamoelectric machine such as a DC generator, the remainder of whose structure is omitted as not material to the invention. An example of a signal received by monitor 16 from brush 20 or 24 during an alignment test is given in FIG. 2. This composite signal includes high-frequency information signals (i) associated with buck or boost currents (the generally upward pattern of high-frequency signals illustrated in FIG. 2 being more typical of boost currents) and which appear to "ride" on top of various noise signals. The noise signals comprise low-frequency components such as power frequency ripple indicated generally as (l) and whose wave length extends substantially over the entire time interval shown in FIG. 2; sawtooth-shaped components (r) whose presence is due to slot and bar arrangements within the generator and which typically occur at fundamental bar and slot frequencies (and their harmonics) up to about 30 kilohertz; and may also include high-frequency noise spikes (omitted from FIG. 2 but which would, if shown, appear lower in amplitude and fewer in number than the information signals (i)) caused, for example, by recurring switching of diodes in the excitation system of the generator.

To separate the information signals (i) to be measured from the other components present in the composite signals from brushes 20 and 24, monitor 16 includes several processing networks as shown in the block diagram of FIG. 1. Terminals 18 and 22, which receive the composite signals, are connected to a first filter network 30 which is provided to remove the low-frequency components (l) from the composite signal input thereto. Filter network 30 in turn is connected to clipping network 32 which functions to limit the positive and negative excursions of the signals to protect system circuitry and to prevent possible high-amplitude transients or noise spikes from introducing significant errors in the output signals calculated by monitor 16. From clipping network 32, the signals are fed to a second filter network 34 which removes all remaining signal components having frequencies less than a preselected value such as 30 kilohertz. The major components eliminated by filter network 34 are the sawtooth-shaped components (r) shown in FIG. 2 which occur at fundamental frequencies known from the slot and bar geometric parameters of the generator. The clipped and twice-filtered signals, which now comprise high-frequency information signals (i) associated with the buck or boost current applied to the generator and possibly also include a limited number of high-frequency noise components, are directed to rectifier 36 which reverses the sign of any negative signal components, then feeds the rectified signals to discriminator network 38. Discriminator network 38 is adapted to combine the rectified signals and at each instant of time to permit passage therethrough of the rectified signal of greatest magnitude. The rectified signal from discriminator network 38 is successively amplified in amplifier 40 and integrated in peak integrator 42 to produce an output signal. Output meter 44 is provided to receive and display the output signal, and alarm system 46 may be included to give a visual and/or audible alarm when the output signal exceeds a level indicative of brush arcing.

Figure 3B:
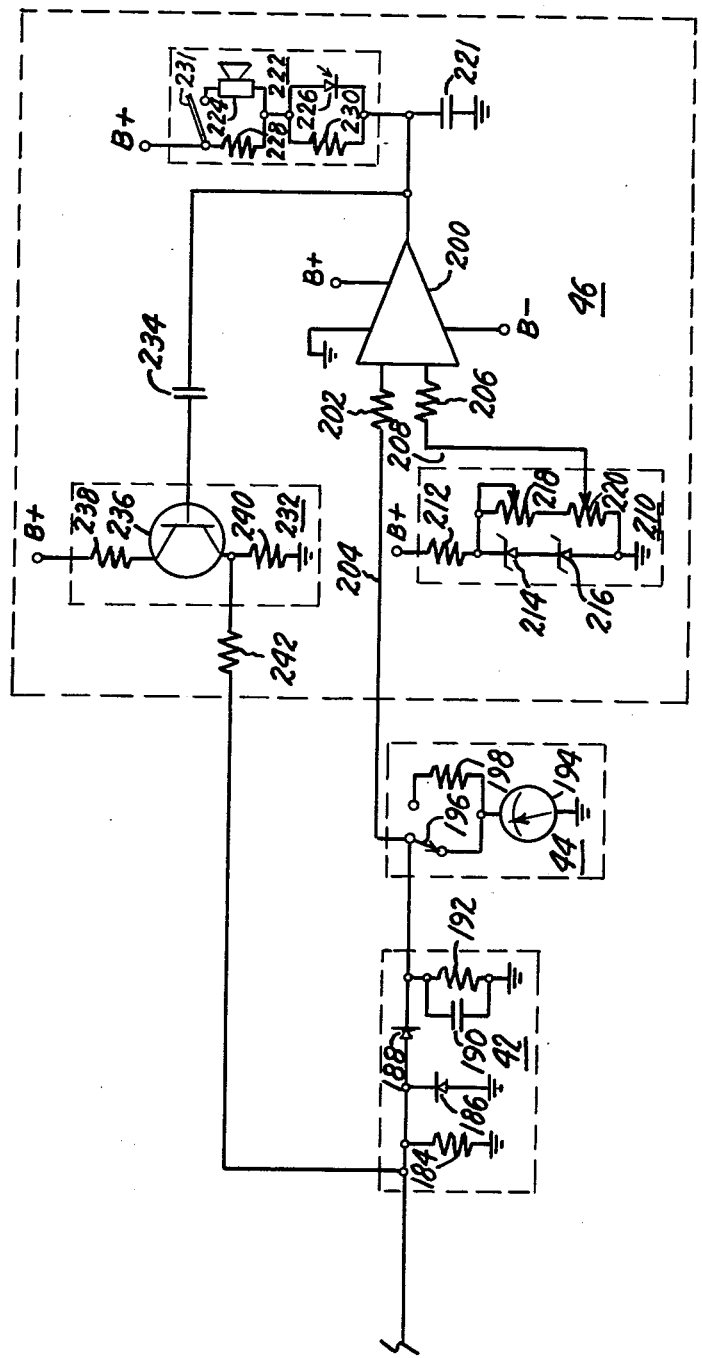

A detailed schematic of a preferred embodiment of the invention illustrated in FIG. 1 is given in FIG. 3 wherein all points marked B+ are connected by a common bus line (not shown) to a positive regulated DC voltage supply, and all points marked B− are connected to a negative regulated DC voltage supply. During a brush alignment test wherein a selected level of buck or boost current is applied to the generator, composite signals from brushes 20 and 24 are received at input terminals 18 and 22 and pass through filter network 30 which includes an RC-filter connected to terminal 18 and comprising capacitor 48 and resistor 50 and an RC-filter connected to terminal 22 and comprising capacitor 52 and resistor 54. The RC-filters remove low-frequency components (l) such as may be present at power-generating frequencies and their harmonics; then the filtered signals are applied through current-limiting resistors 56 and 58 to clipping network 32. In network 32 oppositely poled series-connected Zener diodes 60 and 62 limit the positive and negative excursions of the filtered signals from positive brush 20 to preselected values such as +7 and −7 volts, and oppositely poled series-connected Zener diodes 64 and 66 clip the filtered signals from negative brush 24 to similar values. To remove additional noise from the clipped signals, these signals are passed to filter network 34 which includes two T-type LC-filters, one filter 34a connected to positive brush 20 and comprising capacitor 68, inductor 72, capacitor 74, and tuning resistor 76, and a second filter 34b connected to negative brush 24 and comprising capacitor 70, inductor 78, capacitor 80, and tuning resistor 82. These LC-filters remove noise components (r) (see FIG. 2) at fundamental bar and slot frequencies and their harmonics up to, for example, a cutoff frequency of 30,000 hertz, providing clipped and twice-filtered signals containing only the high-frequency information signals of interest and possibly a small number of high-frequency noise spikes.

Since it is desirable in the preferred embodiment of the invention shown in FIG. 3 that the output signal associated with buck or boost current be derived from an information signal of maximum amplitude, and since the signal of maximum amplitude at any given time may readily be determined using a diode network operating only on positive signals, the clipped and twice-filtered signals leaving network 34 are next applied through capacitors 84 and 86 to rectifier 36 which reverses the sign of any negative components in the clipped and twice-filtered signals. Rectifier 36 includes a transformer 88 which is responsive to signals from positive brush 20 and has a primary winding 89 referenced to ground through resistor 90 and a secondary winding 91 with a center tap 92 referenced to ground through resistor 93. Positive components of the clipped and twice-filtered signals entering transformer 88 are transmitted through blocking capacitor 94 into discriminator network 38 while negative components are transformed into positive components and directed through capacitor 95 to discriminator network 38, capacitors 94 and 95 acting to prevent saturation of the core of transformer 88. A similar transformer 96 is provided to receive signals from negative brush 24 and includes primary winding 97 connected to ground through resistor 98 and secondary winding 99 connected to ground through resistor 100 and is adapted to feed rectified signals through blocking capacitors 101 and 102 to discriminator network 38.

Signals from rectifier 36 are directed through biased diodes 104, 106, 108, and 110 in discriminator network 38 and through capacitors 112 and 114 to junction 108, discriminator network 38 acting to pass through junction 108 at any given time the rectified signal of maximum amplitude. Forward bias for the diodes of network 38 is provided by resistor pairs 112 and 114, 116 and 118, 120 and 122, 124 and 126 connected respectively to the anodes of diodes 104, 106, 108 and 110; and reverse bias is provided by a first resistor network connected to the cathodes of diodes 104 and 106 and including resistors 128, 130, 132 and potentiometer 134, and a second resistor network connected to the cathodes of diodes 108 and 110 and including resistors 136, 138, 140 and potentiometer 142. Potentiometers 134 and 142 permit adjustment of diode reverse bias, while resistors 132 and 140 are preferably silicon resistors (sensistors) with a temperature coefficient of resistance of approximately 0.7 ohms/°C. over an ambient temperature range of about −60° C. to +150° C. Silicon resistors 132 and 140 thus are operable to apply a temperature-varying reverse bias to diodes 104, 106, 108 and 110 to compensate for the change in inherent threshold potential of these diodes of approximately 2 millivolts/°C. and thus to maintain constant threshold sensitivity and accuracy of signals passed through discriminator 38.

To amplify the rectified signal received at junction 108, this signal is fed to amplifier 40, which comprises a common emitter amplifier connected between two emitter followers and separated therefrom by capacitors 152 and 154. The first emitter follower, which includes transistor 156 with bias resistors 158 and 160 connected to its base and resistor 162 connected between its emitter and ground, acts as a buffer between discriminator network 38 and the common emitter amplifier connected between capacitors 152 and 154. Transistor 164, whose base receives the rectified information signal applied through capacitor 152, is part of a common emitter amplifier which also includes bias resistors 166 and 168 connected to the base of transistor 164 and also, respectively, to the B+ bus line and ground; resistor 170 connected between the B+ bus line and the collector of transistor 164; and resistor 172 and capacitor 174 connected between the emitter of transistor 164 and ground. The amplified signal appearing at the collector of transistor 164 passes through capacitor 154 to the base of transistor 176, which is part of an emitter follower connected between the B+ bus line and ground and provided to prevent excessive loading of the collector of transistor 164 and which also includes bias resistors 178 and 180 and emitter resistor 182.

Since amplification of the rectified information signal may introduce some negative signal components, and in order to further condition these components for display by output meter 44, the amplified signals appearing at the emitter of transistor 176 are fed through capacitor 182 to peak integrator 42. Integrator 42, which comprises resistor 184, diodes 186 and 188, and capacitor 190 and resistor 192 connected in parallel between the anode of diode 188 and ground, functions as a filtered rectifier to produce a DC output signal whose amplitude is proportional to the peak amplitude of the signal from amplifier 40. The output signal from peak integrator 42 is directed to output meter 44 which includes means such as voltage meter 194 for displaying the output signal and may also be provided with variable gain, for example by means of switch 196 and resistor 198.

To indicate the presence of brush arcing during brush alignment buck and boost tests, an alarm system 46 is provided in the preferred embodiment whose schematic is shown in FIG. 3. Alarm system 46, which is similar to that of the brush arc monitor shown and described in the aforementioned application Serial No. 901,579 by Sawada et al, commonly assigned, includes a high-speed comparator 200 responsive to output signals applied thereto from peak integrator 42 through input resistor 202 in line 204. Also applied to comparator 200 through an input resistor 206 in line 208 is a reference signal from reference set point network 210, which comprises resistor 212 connected between the B+ bus line and series-connected Zener diodes 214 and 216, and series-connected potentiometers 218 and 220 arranged in parallel with diodes 214 and 216. Potentiometers 218 and 220 provide means for adjusting the level of reference signal applied from the wiper arm of potentiometer 220 through line 208 to comparator 210 to compensate for changes in the level of output signal at which brush arcing first occurs, e.g., due to varying levels of generator load, and also to permit adjustment of the threshold increment of voltage usually added to the known output voltage for incipient arcing to prevent premature triggering of an alarm due to transients.

The output of comparator 200 is referenced to ground through capacitor 221 and is also connected to an alarm 222 which is activated when the output signal from peak integrator 44 applied to comparator 200 exceeds the reference signal applied thereto. Alarm 222 may be any device suitable to indicate firing or tripping of comparator 200, and in the brush alignment apparatus of FIG. 3 includes an audible alarm 224 and light-emitting diode (LED) alarm 226 arranged in current-dividing networks with resistors 228 and 230, these resistors providing multiple signal paths so that if either alarm fails the remaining one will still remain operative. Switch 231 permits audible alarm 224 to be disconnected and rendered inoperative if desired. Alarm system 46 may also include a feedback amplifier 232 coupled to the output of comparator 200 by capacitor 234 and which comprises transistor 236 arranged in a common emitter amplifier configuration with its emitter connected to the B+ bus line through resistor 238 and its collector connected to ground through resistor 240. Upon the occurrence of an alarm, amplifier 232 feeds a step change in signal through resistor 242 to the input of peak integrator 42 resulting in a large change in the peak integrator output signal displayed by output meter 44 and hence a further indication of the onset of brush arcing. This feature is particularly desirable if audible alarm 224 and/or LED alarm 226 are inoperative or if output meter 44 includes a chart recorder for generating a time history of output signal.

The brush alignment monitor whose schematic is set forth in a manner which permits alarm system 46 to react at the point of incipient brush arcing only if the buck and boost output signals at which arcing occurs have been predetermined as by visual observation of arcing and the level of reference signal of set point network 210 has been set at, or a threshold amount above, this value of output signal. In another embodiment of the invention, whose partial schematic is given in FIG. 5 and which is, except for alarm system 250, identical to the brush alignment monitor of FIG. 3, means are provided for automatically adjusting the reference signal applied to comparator 200 along line 208 for changes in output signal due only to changes in buck and boost information signal so that alarm system 250 may provide a direct indication of the onset of brush arcing without the need for preliminary visual observations. To accomplish this automatic compensation wherein the reference signal "follows" the buck and boost output signals, alarm system 250 includes in addition to the elements of alarm system 46 described in connection with FIG. 3, a peak integrator 252 connected through capacitor 254 to point 256 at the output of amplifier 40, and summing amplifier network 258 connected between comparator 200 and reference set point network 260. Summing amplifier network 258 combines an integrated signal from peak integrator 252 with a reference set point signal from network 260 to produce a reference signal which automatically adjusts for changes in applied buck and boost currents.

The components comprising reference set point network 260 and peak integrator 252 are similar to those of network 210 and peak integrator 42 of the brush alignment monitor of FIG. 3, with the following two exceptions. First, the diodes of network 260 and peak integrator 252 are oriented in the opposite sense from those of network 210 and peak integrator 42 and network 260 is connected to the B− bus line to produce negative signals since summing amplifier network 258 operates to invert as well as combine the signals input thereto. Second, resistor 262 and capacitor 264 of peak integrator 252 are selected so as to provide integrator 252 with a time constant longer than that of integrator 42 (e.g., by a factor 50) so that integrator 252 will absorb or at least delay passage therethrough of signal changes due to short bursts of high-frequency output signal associated with brush arcing which it is desired not be immediately reflected as changes in the level of reference signal applied to comparator 200 along line 208. Delay or blockage of the brush arcing signals relative to those included in the output signal applied to comparator 200 along line 204 is required to permit tripping of comparator 200 when arcing commences.

Figure 5:
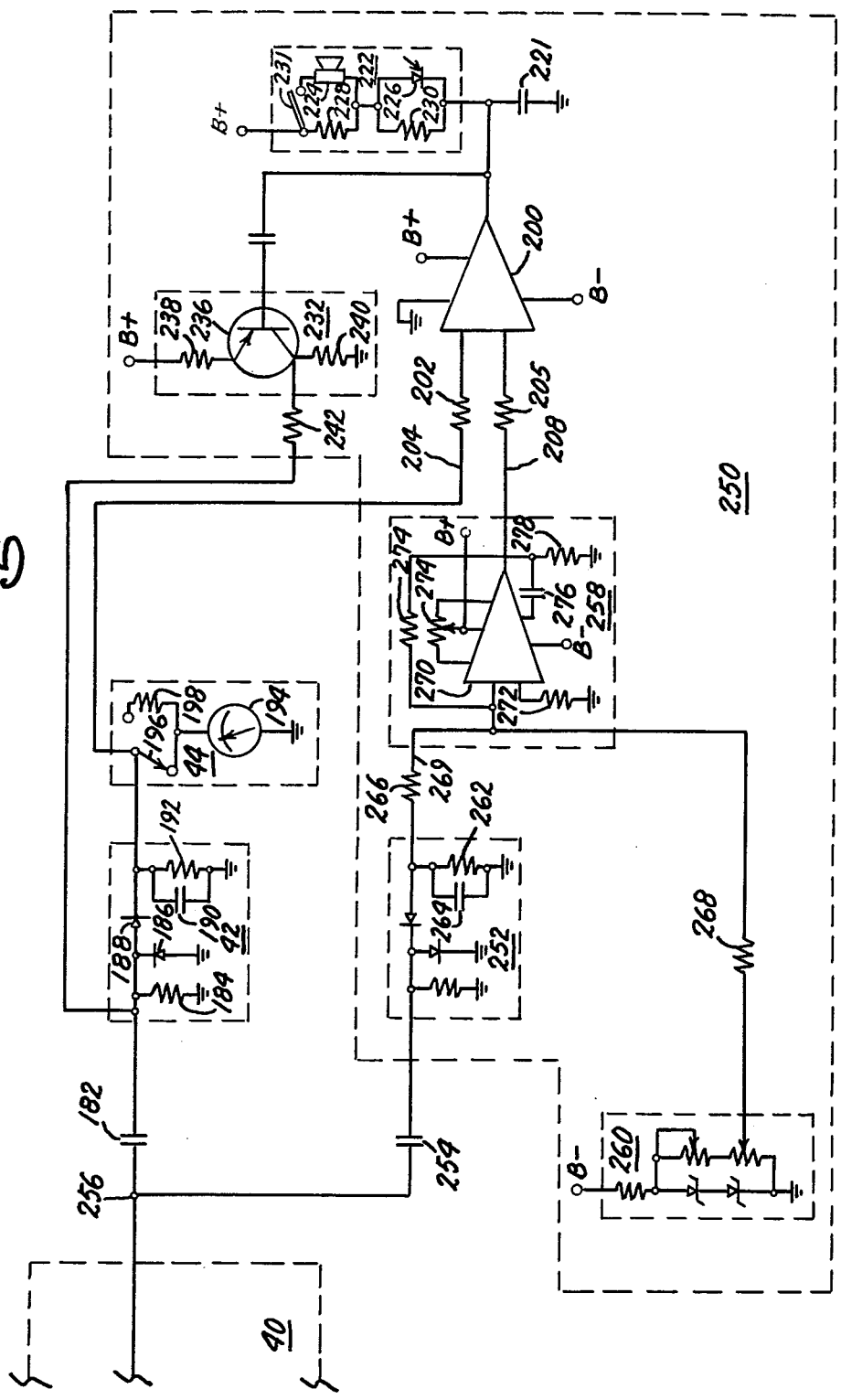
FIG. 5 is a partial schematic of an alternate embodiment of the invention adapted to detect brush arcing in addition to facilitating brush alignment.

Summing amplifier network 258 is adapted to receive the output signal from peak integrator 252 through resistor 266 and a reference set point signal from network 260 through resistor 268, this reference set point signal being equal in magnitude to the threshold increment of signal (such as ½ volt) to be added to each buck or boost output signal to prevent activation of comparator 200 by transients or other spurious signals not indicative of brush arcing. These signals are applied along line 269 to a first input of operational amplifier 270, which changes their sign and adds the signals, and the reference signal appearing at the output of operational amplifier 270 is then fed to comparator 200 along line 208. Upon the occurrence of brush arcing, the output signal applied to comparator 200 along line 204 exceeds the reference signal applied thereto along line 208 since arcing signals are delayed in peak integrator 252 and thus are not immediately reflected in the reference signal, and alarm 222 is thus activated. Also included in the summing amplifier network 258 shown in FIG. 5 are resistor 272 connected between a second input of amplifier 270 and ground, potentiometer 274 connected between two terminals of amplifier 270 for nulling adjustments, a feedback loop including resistor 274, and capacitor 276 and resistor 278 connected between amplifier 270 and ground to facilitate removal of noise inherent in amplifier 270.

Operation of brush alignment monitor 16 during a test wherein a specified level of buck or boost current is applied to a generator whose brushes are being aligned may be readily understood from the following review of signal processing performed by the various components illustrated in FIGS. 1 and 3. Composite signals received at inputs 18 and 22 from brushes 20 and 24 are first filtered to remove low-frequency components such as occur at power-generating frequencies and their harmonics, clipped by Zener diodes 60, 62, 64, and 66, and then filtered a second time in two T-type LC-filters of network 34 which remove components at fundamental bar and slot frequencies of the generator. The clipped and twice-filtered signals are fed to rectifier 36 where any negative components are transformed to positive components and then to discriminator network 38, which passes to amplifier network 40 only the maximum rectified signal at any given time from the positive and negative brushes. This rectified signal is amplified, then integrated in peak integrator 42 and applied to output meter 44 and to one input of comparator 200 in an alarm system. Output meter 44 displays an output signal whose level, together with the level of applied buck or boost current, is indicative of the brushholder rigging adjustment, if any, required to align the generator brushes to the optimum arc-free position. For values of applied buck or boost current sufficient to initiate arcing during alignment tests, the alarm system of monitor 16 activates an audible and/or visible alarm at the onset of arcing. Triggering of alarm 222 may, as provided in alarm system 46 of FIG. 3, serve merely as an indicator of arcing which from independent observation is known to occur at predetermined values of output signal; or the alarm system may, as in the embodiment of FIG. 5, permit actual detection of brush arcing. The latter embodiment eliminates the need for visual observations to determine arcing and gives a direct indication of the width of the black band or arc-free range of operation of the generator.

Figure 6:
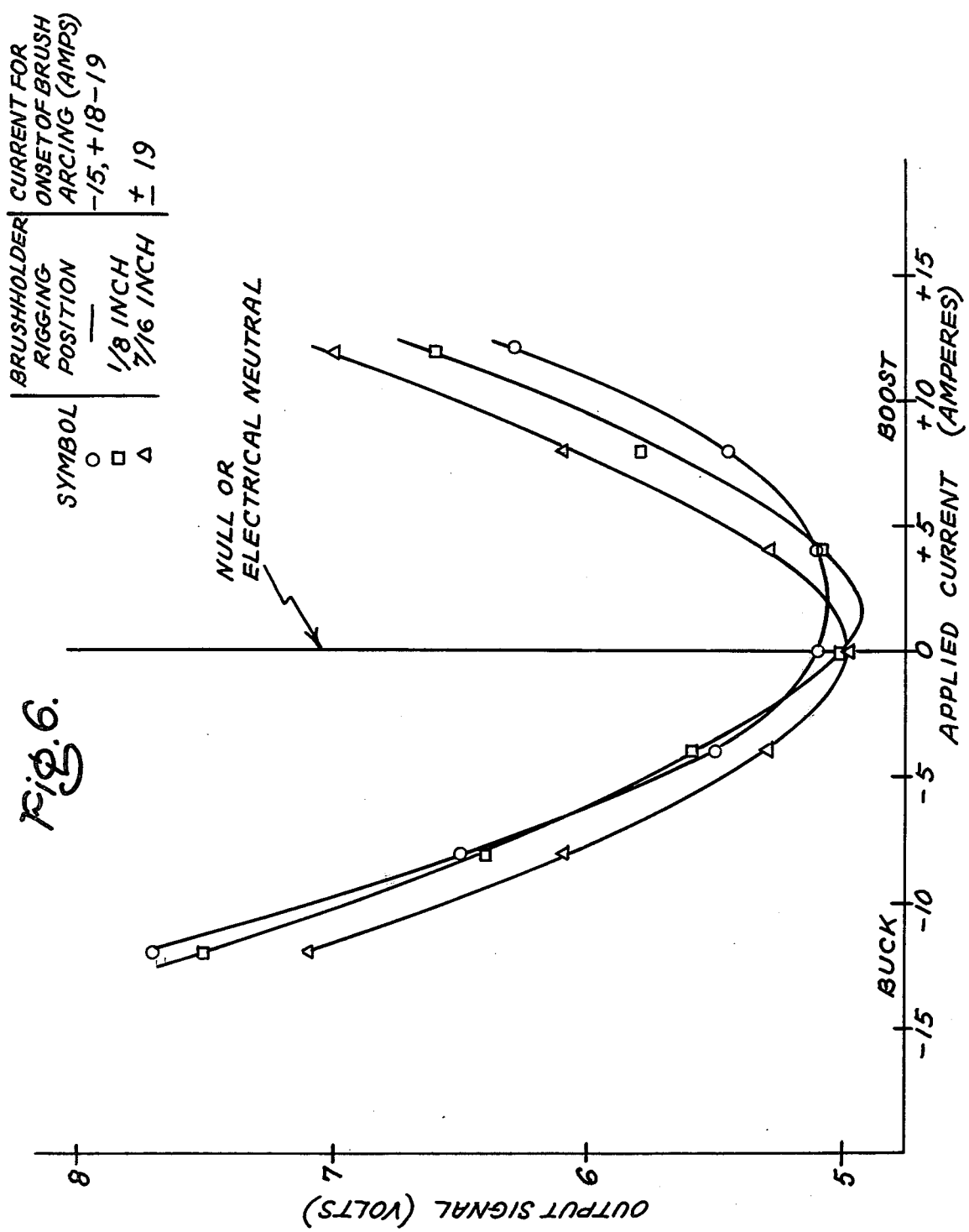
FIG. 6 is a graph showing plots of test values of brush output signal versus applied current as measured by a preferred embodiment of the invention for various brushholder rigging positions.

FIG. 6 shows plots of output signal as recorded by output meter 44 at selected buck and boost currents applied to a 400 kilowatt DC generator during alignment of its brushes using the alignment monitor 16 shown in FIG. 3. With the brushholder rigging of the generator in an initial or base position, the minimum output signal occurred at approximately 1.5 amperes of applied current on the boost side of electrical neutral, and brush arcing was noted at about 15 amperes buck current and 18–19 amperes boost current. To shift the minimum output portion of the curve closer to electrical neutral and extend the arc-free range of operation, the brushholder rigging was shifted ⅛ inch, then an additional 5/16 inch in the direction of rotation of the generator to yield a curve whose minimum output signal occurred at electrical neutral and whose arc-free range was about 19 amperes on the boost side and on the buck side of electrical neutral. Since additional buck and boost tests of this generator at different loadings did not produce significant shifts in the output signal curve or change the values of buck or boost current for incipient brush arcing, the optimum alignment for the brushes of this 400 kilowatt generator had been achieved at this last rigging setting.

It should be appreciated with respect to the above example and alignment of other generators that although the location of minimum output signal with respect to electrical neutral suggests the direction but not the amount of rigging adjustment required to achieve the optimum arc-free position, approximate values of the magnitude of adjustment desired can readily be determined by correlating test data from alignment of generators of a particular size and rating.

Figure 7A:
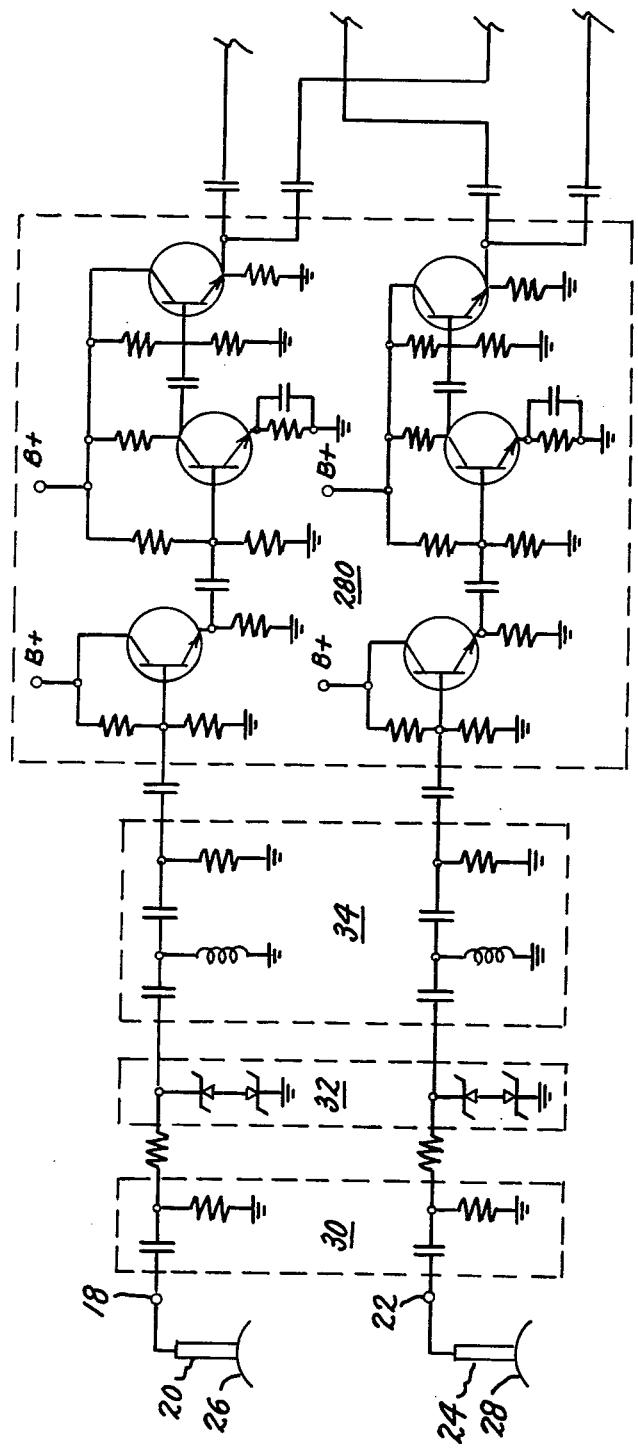
FIGS. 7a and 7b are a schematic of another embodiment of the invention.
Figure 7B:
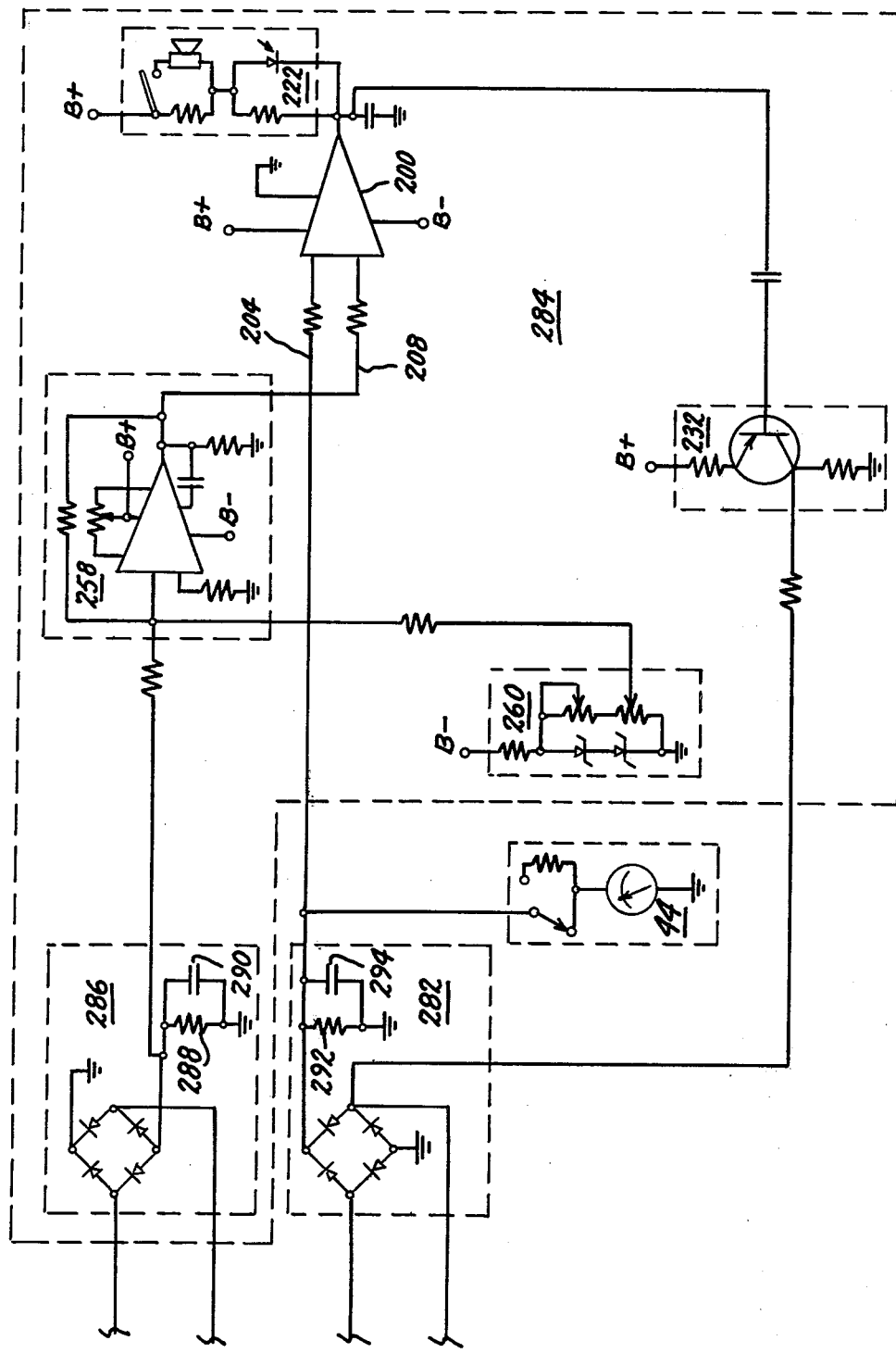

FIG. 7 shows another embodiment of the brush alignment monitor similar to that given in FIG. 5 in that both detect brush arcing in addition to quickly and accurately calculating output signals associated with the application of buck or boost currents to a wide range of generators. As is evident, however, the amplification and rectification networks of the embodiment set forth in FIG. 7 differ somewhat from those of the monitor shown in FIGS. 3 and 5. For example, amplifier network 280 includes two subnetworks each similar to amplifier network 40 of the brush alignment monitor of FIG. 3 and connected to filter network 34 to amplify signals from brushes 20 and 24 prior to rectification. This arrangement may be particularly desirable for aligning small generators whose relatively low strength signals may require early amplification for optimum alignment. Rectification of signals from amplifier network 280 is accomplished in diode bridge rectifier 282 whose output is applied along line 204 to comparator 200 of alarm system 284. A second diode bridge rectifier 286 within alarm system 284 also responds to signals from amplifier network 280 and passes a signal to summing amplifier network 258, with resistor 288 and capacitor 290 of rectifier 286 selected to provide a somewhat longer time constant than resistor 292 and capacitor 294 of rectifier 282 to absorb or delay passage of brush arcing signals to summing amplifier network 258 and thence along line 208 to comparator 200 so that alarm system 284 may, like alarm system 250 of the embodiment shown in FIG. 5, operate to detect the onset of brush arcing.

While the invention has been described in detail with reference to certain preferred embodiments operative to align brushes of a generator, it is understood that various modifications and alternative uses, such as in alignment of brushes of motors, will be apparent to those skilled in the art. It is intended by the appended claims to cover all such modification and uses which are within the true spirit and scope of the present invention.

What is claimed is:

1. Apparatus for aligning brushes of a dynamoelectric machine to minimize arcing of the brushes, said apparatus comprising:

means for receiving from a brush of the dynamoelectric machine a composite signal including noise signals and high-frequency information signals, said composite signal produced during an operating mode of the dynamoelectric machine wherein a buck or boost current is superimposed on a preselected level of excitation current applied to the machine;

a first filter network for removing low-frequency components of said noise signals from said composite signal;

a clipping network connected to said first filter network for removing from said composite signal all components having an absolute value of amplitude in excess of a preselected value.

a second filter network for removing from said composite signal substantially all of the components of said noise signals input to said second network filter and having frequencies less than a cutoff value determined from the fundamental slot and bar frequencies of the dynamoelectric machine;

means for rectifying the filtered and clipped signal from said second filter network to provide a rectified signal;

means for amplifying and integrating said rectified signal to produce an output signal, said output signal, together with the level of said boost or buck current, being indicative of brush alignment adjustment required to minimize brush arcing; and an output meter for displaying said output signal.

2. The apparatus of claim 1 wherein said clipping network is adapted to remove all signal components having amplitudes greater than 7 volts and said second filter network is adapted to remove substantially all of the components of said noise signals input to said second filter network and having frequencies less than 30 kilohertz.

3. The apparatus of claim 1 wherein said signal receiving means, said filter networks, said clipping network, and said rectification means comprise a first signal path for processing a composite signal from a positive brush and a second signal path in parallel with said first signal path for processing a composite signal from a negative brush, and said apparatus further includes a discriminator network responsive to rectified signals from said rectification means and adapted to permit passage through the discriminator network at any given time during operation of said apparatus the rectified signal of maximum magnitude.

4. The apparatus of claim 3 further including an alarm system responsive to said output signal and adapted to produce an alarm signal when said output signal exceeds a reference signal.

5. The apparatus of claim 3 wherein said discriminator network includes a plurality of diodes and means for applying bias to said diodes such that the threshold potential of each of said diodes remains substantially constant over an ambient temperature range of about −60 to +150 degrees Celsius.

6. The apparatus of claim 4 wherein said means for amplifying and integrating said rectified signal comprises an amplifier network responsive to the rectified signal of maximum magnitude and a peak integrator connected between said amplifier network and said output meter.

7. The apparatus of claim 6 wherein said alarm system comprises:

a reference set point network for producing a reference signal;

a comparator having a first input adapted to receive an output signal from said peak integrator, a second input adapted to receive a reference signal from said reference set point network, and an output adapted to provide an alarm signal when said output signal exceeds said reference signal; and an alarm connected to said comparator output.

8. The apparatus of claim 7 wherein said alarm system also includes means for automatically adjusting said reference signal for changes in output signal due to changes in applied buck or boost current so that said apparatus is operable to detect directly the presence of brush arcing components within said high-frequency information signals.

* * * * *